United States Patent [19]

Viola

[11] Patent Number: 4,550,325

[45] Date of Patent: Oct. 29, 1985

[54] DROP DISPENSING DEVICE

[75] Inventor: Michael S. Viola, Burlington, Mass.

[73] Assignee: Polaroid Corporation, Cambridge, Mass.

[21] Appl. No.: 686,454

[22] Filed: Dec. 26, 1984

[51] Int. Cl.[4] ........................ G01D 15/18; B67D 5/00; B05B 17/06; H01L 41/04

[52] U.S. Cl. ................................ 346/140 R; 222/202; 222/420; 239/102; 310/328; 310/359

[58] Field of Search .................... 346/140 R; 222/420, 222/202; 239/102; 310/328, 359

[56] References Cited

U.S. PATENT DOCUMENTS 3,922,622 11/1975 Boyd et al. .................... 333/30 R X
3,965,376 6/1976 Arndt ................................. 310/328
4,068,144 1/1978 Toye ............................... 310/327 X
4,326,205 4/1982 Fischbeck et al. ............. 346/140 R
4,474,326 10/1984 Tamahashi .......................... 239/102

*Primary Examiner*—Joseph W. Hartary
*Assistant Examiner*—Gerald E. Preston
*Attorney, Agent, or Firm*—Philip G. Kiely

[57] ABSTRACT

A fluid drop dispenser is fabricated from an injection moldable plastic and includes inner and outer components each having an end wall and an axially extending cylindrical wall that define a respective counterbore for each component. The inner component is assembled to the outer component with the respective outer and inner axially extending walls defining an annular fluid receiving chamber therebetween. A nozzle is provided in the outer wall through which drops are ejected on demand. A piezoelectric actuator disc is mounted within the inner component with its periphery bonded to the cylindrical wall of the inner component. When the actuator disc is electrically excited, it undergoes a radially outward expansion to cause a predetermined quantity of fluid to be ejected from the annular chamber through the nozzle.

30 Claims, 7 Drawing Figures

FIG. 1
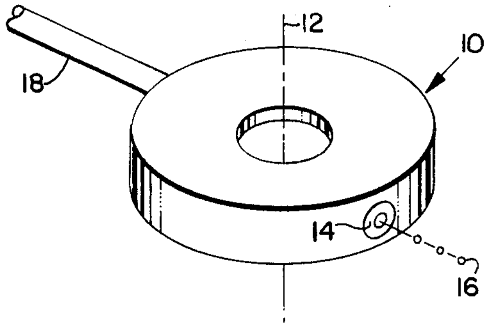
FIG. 3
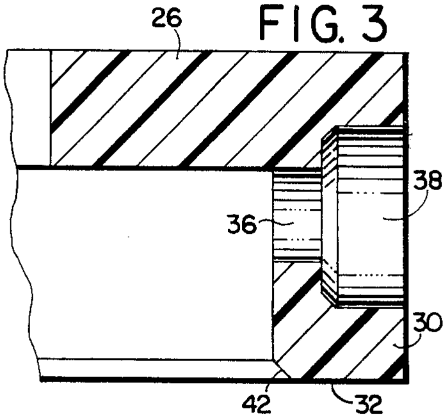
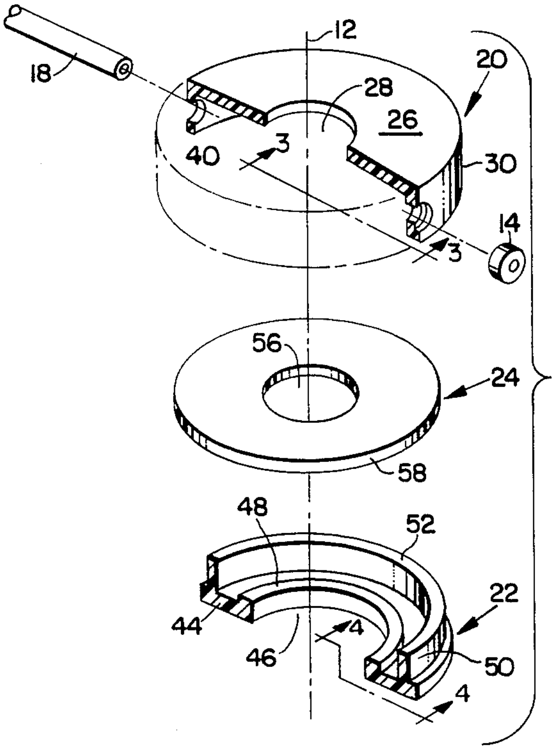
FIG. 2
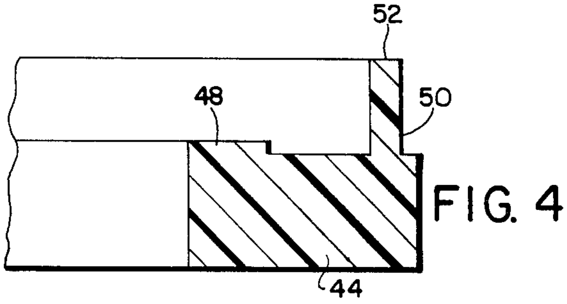
FIG. 4

DROP DISPENSING DEVICE

BACKGROUND OF THE INVENTION

The present invention relates to apparatus for dispensing fluid droplets. More particularly, it concerns an apparatus for dispensing fluid droplets on demand useful in various drop dispensing applications including ink jet printers.

Devices for the formation and dispensing of fluid droplets on demand, such as those utilized in ink jet printers, typically include a fluid-receiving chamber that is connected to a supply of fluid and to a droplet emitting nozzle or orifice. When a fluid drop is desired, the fluid is perturbed in some way to cause a predetermined volume of the fluid to issue from the nozzle in a drop-wise manner. In some devices, the fluid is exposed directly to an electric or magnetic field to cause drop-wise ejection. In other devices, the volume of the fluid chamber is momentarily reduced to force a predetermined quantity of the fluid through the nozzle. In the latter type of system, the fluid-containing chamber is defined by various wall portions with at least one of the wall portions provided with a measure of flexure. An electroactuator, typically in the form of a piezoelectric device, is connected to the flexible wall portion so that excitation of the actuator causes the connected wall to flex in such a way that the volume of the fluid chamber is momentarily reduced to force a predetermined quantity of the fluid through the nozzle in a drop-wise manner. The flexed wall thereafter returns to its initial position with replacement fluid provided from the supply reservoir.

In the past, the costs associated with the manufacture of reliable and durable drop dispensers have been relatively high because of the small physical size of the various components from which the drop dispensers are assembled and the dimensional precision required to produce devices having fluid containing chambers that will repeatedly dispense droplets of uniform volume. Many drop dispensers have been manufactured from various metals, ceramics, and glasses which materials can be formed by known micro-machining, etching, and other shaping techniques to define small volume fluid-receiving chambers which undergo a consistent volumetric reduction in response to operation of an electroactuator. As can be appreciated, however, any manufacturing process that involves multiple machining, shaping, or assembly steps to produce a reliable drop dispenser is inconsistent with inexpensive, high volume production.

Efforts have been made in the direction of forming drop dispensers from injection molded plastics. Typical design considerations in selecting a plastic include its elasticity and its ability to be molded into small precise-dimensioned components as well as the ability to be molded into elastic thin wall sections. Accordingly, a need arises for an on-demand drop dispensing device that can be efficiently and inexpensively manufactured compared to prior devices from conventional plastic resins that are well suited for injection molding.

U.S. Pat. No. 4,245,227, issued Jan. 13, 1981 is directed to an ink jet head having inner and outer cylindrical members wherein only the outer cylindrical member is a piezoelectric element in the case of a single nozzle. In the case of multiple arrays of nozzles both inner and/or outer cylindrical members may be piezoelectric members. The piezoelectric element vibrates radially when electrically excited to produce vibrations in the ink thereby ejecting the ink through the nozzles. It should be noted that the piezoelectric element is in direct contact with the ink. Such an arrangement requires that the ink be non-conductive.

U.S. Pat. No. 4,387,383, issued June 7, 1983, is directed to a multiple nozzle ink jet head which comprises an array of ink droplet producing devices arranged in a stacked sandwich-like manner. The ink jet head comprises a first cavity having a supply of ink and a second cavity which contain a plurality of droplet producing devices in stacked relationship comprising a conductive element, an annular element for containing ink in said second cavity and a transducing element such as a piezoelectric element in contact with the ink. The ink is identified as an ink of low conductivity.

U.S. Pat. No. 4,434,430, issued Feb. 28, 1984, is directed to an ink jet head wherein a piezoelectric element is bonded to a planar vibration plate formed of a synthetic resin. Activation of the piezoelectric element flexes the vibration plate normal to its plane thereby displacing ink in the adjacent chamber. In an alternative embodiment, the piezoelectric element is formed of a high molecular weight piezoelectric material which can double as the vibration plate.

SUMMARY OF THE INVENTION

In accordance with the present invention, an apparatus for dispensing fluid droplets includes a plastic resin body having a fluid-receiving chamber defined along a path by at least two spaced apart walls. A nozzle is provided in fluid communication with the fluid chamber through which nozzle a predetermined quantity of fluid is ejected in a drop-wise manner. An electroactuator having a peripheral surface is connected to one of the walls defining the chamber so that electrical actuation thereof causes a predetermined volume of fluid to pass from the fluid chamber through the nozzle for ejection in the form of a droplet.

In the preferred embodiment, the drop dispenser is fabricated from an injection moldable plastic resin and includes an outer component having a cylindrical wall closed at one end by an end wall to define a counterbore or cavity for coaxially receiving therein an inner component that also includes a cylindrical wall closed at one end by a respective end wall. The cylindrical walls of the inner and outer components define therebetween an annular fluid receiving chamber. A nozzle is provided in the cylindrical wall of the outer component so that fluid can pass from the annular chamber through the nozzle for drop-wise dispensing. An electroactuator in the form of a circular piezoelectric disc is coaxially received within the counterbore or cavity defined by the cylindrical wall of the inner component with the periphery of the disc bonded to the cylindrical wall of the inner component to couple the actuator with the fluid chamber. Pulsing the piezoelectric actuator, for example, by application of a DC pulse, causes the actuator to undergo radially outward expansion and inward contraction which, in the expansion stage causes a predetermined amount of fluid to be ejected from the nozzle in a drop-wise manner.

The device of the present invention is particularly well suited for ink jet printers in which droplets of ink are directed in a controlled manner onto a recording media. The device of the present invention can be formed from various synthetic plastic resins including glass filled and reinforced resins which can be molded using conventional injection molding techniques.

A principal objective of the present invention is, therefore, the provision of an improved drop dispensing device that can be manufactured from plastic resins in a straight forward and relatively inexpensive manner compared to prior devices. Other objects and further scope of applicability of the present invention will become apparent from the detailed description to follow, taken in conjunction with the accompanying drawings, in which like parts are designated by like reference characters.

BRIEF DESCRIPTION OF THE DRAWINGS

FIG. 1 is an isometric projection of a drop dispensing device in accordance with the present invention;

FIG. 2 is an exploded isometric projection of the drop dispensing device of FIG. 1 with selected portions broken away for reasons of clarity;

FIG. 3 is a partial side elevational view, in cross section, of an outer component of the drop dispensing device of FIG. 1 taken along line 3—3 of FIG. 2;

FIG. 4 is a partial side elevational view, in cross section, of an inner component of the drop dispensing device of FIG. 1 taken through line 4—4 of FIG. 2;

DESCRIPTION OF THE PREFERRED EMBODIMENT

Figure 5:
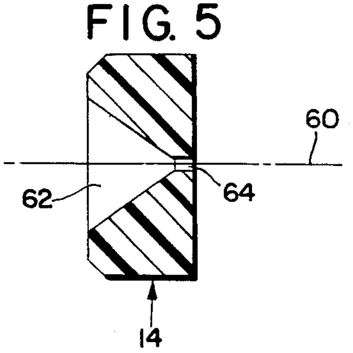
FIG. 5 is a side elevational view, in cross section, of a drop dispensing nozzle.

A drop dispensing apparatus in accordance with the present invention, termed herein as a drop dispenser, is illustrated in the various figures and designated generally therein by the reference character 10. As shown in FIG. 1, the drop dispenser 10 in its preferred form is defined as a generally cylindrical body about an axis 12 and includes a nozzle 14, described in more detail below, from which fluid drops 16 are expelled on demand. An inlet fluid supply conduit 18 is connected to the drop dispenser 10 for supplying a fluid, such as ink, from an appropriate fluid supply source (not shown). In the preferred embodiment, the drop dispenser 10 has a nominal ouside diameter of 0.316 inches and an axial height or thickness dimension of 0.100 inches.

As shown in the exploded view of FIG. 2 and the detailed views of FIGS. 3 and 4, the drop dispenser 10 is assembled from complementary outer and inner components, 20 and 22, an electroactuator 24, and the nozzle 14.

The outer component 20 is formed symmetrically about the central axis 12 and includes a circular end wall 26 having a concentric bore 28 formed therein. A cylindrical wall 30 extends axially from the end wall 26 and terminates with an end surface 32. The end wall 26 and the cylindrical wall 30 define a closed-end cavity or counterbore having a nominal inside diameter and depth for receiving the below described inner component 22. A radially aligned bore 36 and coaxial counterbore 38 (FIG. 3) are provided in the cylindrical wall 30 for receiving the nozzle 14, and another bore 40 (FIG. 2) is provided for connection to the fluid supply conduit 18. A chamfered surface 42 (FIG. 3) is provided on the inner edge of the cylindrical wall 30 to assist in the assembling and sealing of the drop dispenser 10 as explained below.

The inner component 22, like the outer component 20, is formed symmetrically about the axis 12 and includes a circular end wall 44 having a concentric bore 46 formed therein. A raised circular boss or pad 48 is formed adjacent the bore 46 concentrically about the axis 12 and, as described below, assists in locating the electroactuator 24 in the assmbled drop dispenser 10. A cylindrical wall 50 extends axially from the circular end wall 44 and terminates in a flat end surface 52. The circular end wall 44 has an outside diameter that is less than the inside diameter of the cylindical wall 30 of the outer component 20 so that the inner component 22 can be received in the outer component 20 with a line-to-line or nominal clearance fit between the two. The cylindrical wall 50 of the inner component 22 is formed with an outside diameter less than the inside diameter of the cylindrical wall 30 of the outer component 20 so that an annular channel or chamber 54 (FIG. 6) is defined when the inner and outer components 20 and 22 are assembled to one another as described more fully below. The flat end surface 52 of the wall 50 is designed to butt against the end wall 26 of the outer component 20 to define the overall length of the annular chamber 54. In the preferred embodiment, the cylindrical walls 30 and 50 of the outer and inner components 20 and 22 have respective inside and outside diameters of 0.316 and 0.310 inches to provide an annular chamber 54 having a radial thickness dimension of 0.003 inches. Additionally, the wall 50 has an axial length of 0.030 inches to define the axial length of the annular chamber 54.

The electroactuator 24 (FIG. 2) is defined as a piezoelectric disc formed about the axis 12 and includes a central opening 56 and a circular peripheral surface 58. As explained below, the electroactuator 24 undergoes a radially outward expansion as a result of pulsed electrical excitation. The electroactuator 24 is formed at an outside diameter that is nominally equal to the inside diameter of the cylindrical wall 50 of the inner component 22 and has a radial thickness dimension of 0.020 inches, in a preferred embodiment. In the case of the preferred embodiment, the inside diameter of the cylindrical wall 50 is 0.290 inches and, as mentioned above, the outside diameter is 0.310 to provide an inner wall having a wall thickness in the radial direction of 0.010 inches, this radial thickness being relatively thick compared to those prior devices that have utilized a thin (e.g., 0.001 inch) flexible metallic wall between the actuator and the fluid chamber. The electroactuator 24 includes electrodes (not shown) formed on its opposite faces for connection to conductor (not shown) which provide electrical energy for exciting the electroactuator 24 to cause a radially outward expansion.

The nozzle 14, as shown in the cross sectional view of FIG. 5, is formed cylindrically about a nozzle axis 60 and includes a converging entry port 62 that leads to an exit orifice 64, which has a diameter of 0.002 to 0.003 inches in the case of the preferred embodiment. The nozzle 14 is received within the counterbore 38 and can be retained in place with adhesive, solvent, ultrasonic or similar bonding techniques.

In accordance with the invention, the inner component 22 and, preferably, the outer component 20 are both fabricated from a plastic resin, including glass-filled plastic resins, that can be molded by injection molding techniques. Thus, cylindrical wall 50 should have sufficient thickness to be injection molded but should be thin enough so as not to prevent the pulse from the electroactuator 24 from ejecting a drop from nozzle 14. Preferred plastics are styrene acrylonitrile as well as 50% glass-filled polyphenylene sulfide, which latter plastic provides desirably rigid outer and inner components. Additionally, a wide range of plastics are likewise suitable including polycarbonate, polystyrene, acrylonitrile/butadiene/styrene. The outer and inner components can be fabricated from the same or different matrials. Alternatively, the outer component is fabricated from metal, such as the conventinal metals employed in the manufacture of ink jet printing heads.

The drop dispenser 10 is assembled by first inserting the circular electroactuator 24 into the counterbore defined by cylindrical wall 50 of the inner component 22 with the electroactuator lying on the locating pad 48 and its circular periphery 58 in engagement with the inside diameter surface of the cylindrical wall 50. Since the electroactuator 24 undergoes both expansion and contraction, it is important that the peripheral surface 58 of the electroactuator 24 and the inside diameter surface of the cylindrical wall 50 be mechanically connected or bonded together. In the preferred embodiment, the peripheral surface 58 of the electroactuator 24 is solvent bonded to the inside diameter surface of the inner wall 50. Solvent bonding can be achieved by applying a solvent, such as methyl ethyl ketone in the case of a styrene acrylonitrile plastic, about the interface between the two surfaces to temporarily soften the plastic and allow it to flow into the pores or other interstices of the electroactuator material. When the solvent vaporizes, the plastic rehardens to form a secure mechanical bond, as represented generally by the stippled zone 66 in FIG. 6 between the peripheral surface 58 of the electroactuator 24 and the inner wall 50. In an alternative embodiment, an ultraviolet curable adhesive is employed. The electroactuator 24 is not bonded or attached to the locating pad 48 but rests upon and is accurately positioned by the locating pad 48 while the bonding step takes place.

Figure 6:
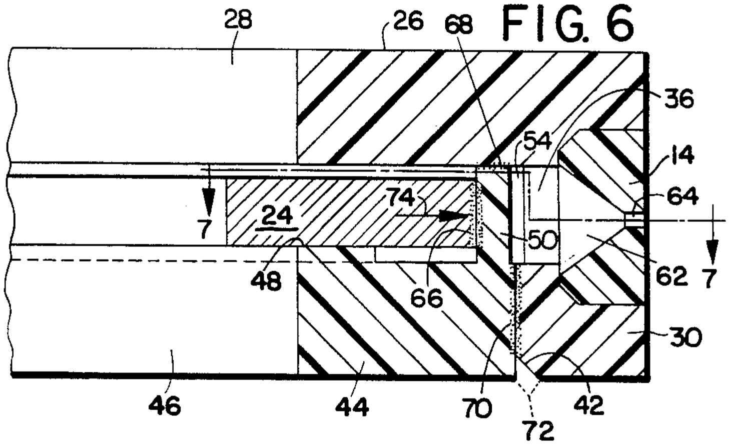
FIG. 6 is a partial side elevational view, in cross section, of the assembled drop dispensing device taken along line 6—6 of FIG. 1.

The inner component 22, with the assembled electroactuator 24, is inserted into the outer component 20 with the chamfered surface 42 functioning to guide the two components together until the flat end surface 52 of the inner wall 50 abuts the circular end wall 26 of the outer component 20 as shown in FIG. 6. The end surface 52 of the wall 50 is bonded to the abutting surface of the circular end wall 26 to achieve a fluid-tight seal. The bonding, which is represented generally by the stippled zone 68 between the end surface 52 and the end wall 26 in FIG. 6, is preferably achieved by ultrasonic bonding, although solvent or adhesive bonding is suitable. The cylindrical outside diameter and the inside diameter surfaces of the inner and outer components 22 and 20 can be bonded by solvent or adhesive bonding to achieve a fluid-tight seal, this bond being likewise represented in FIG. 6 by a stippled zone 70 adjacent these surfaces. In addition, a sealant bead 72 (shown in broken line illustrated in FIG. 6) can be provided in the groove (unnumbered) defined between the chamfered surface 42 and the inner member 22 to also effect fluid sealing.

Electrical connection with the electroactuator 24 can be effected by inserting conductive spring clips or similar devices through the central openings, 28 and 46, to engage the conductive faces of the electroactuator.

Figure 7:
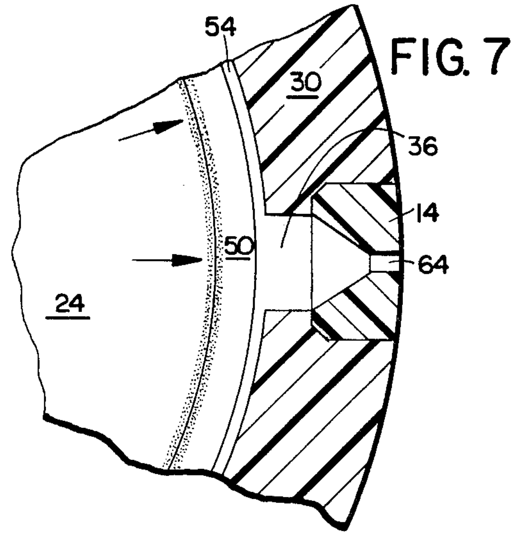
FIG. 7 is a plan view, in cross section, of the drop dispensing device taken along line 7—7 of FIG. 6.

In operation, for example, where the drop dispenser 10 is used for ink drop formation, the drop dispenser 10 is supplied through the conduit 18 from a source of ink (not shown) with the ink filling the annular chamber 54 as well as the entry port 62 of the nozzle 14. In the standby state, no ink is ejected from the orifice 64. When one or more drops are desired, an electrical excitation signal, such as a DC pulse of selected amplitude and duration, is applied to the electroactuator 24 to cause it, as illustrated by the arrows 74 in FIGS. 6 and 7, to expand radially outward to cause the ejection of a predetermined volume of ink from the orifice 64 in the form of a drop 16 typically having a diameter of 60 to 70 microns. A continuous series of drops 16 can be obtained by exciting the electroactuator 24 with recurring pulses at a selected pulse repetition rate. The exact mechanism by which drop ejection occurs is not fully understood, since the inner wall 50, which separates the electroactuator 24 from the ink filled annular chamber 54, can be relatively thick and compliant compared to prior devices where it was conventionally believed that a thin wall, typically metal, provided a measure of necessary flexure to permit a reduction in the volume of the ink containing chamber. It will be noted above, that in the preferred embodiment, the thickness of the plastic wall is 10 times as thick as prior art metal walls. It has been found, surprisingly, that the relatively thick, compliant plastic wall does not absorb or cushion the electroactuator expansion but will in fact transmit sufficient force to effect drop ejection.

Depending upon the manner in which the electrical connection is made to the electroactuator, in the case of a piezoelectric element the application of an electrical pulse can result in outward radial expansion as described above, or alternatively, outward radial expansion occurs when the original applied electrical voltage is removed. In the latter case the electroactuator would be at rest, in a contracted state, during the period of applied voltage. Removal of the epplied voltage would result in the drop ejection expansion.

The drop dispenser of the present invention can be molded from relatively inexpensive plastic materials using injection molding techniques which are well-suited for low-cost volume production. Since the inner wall between the periphery of the electroactuator and the annular ink chamber can be relatively thick (e.g. 0.010 inches) compared to prior devices, the wall thickness criticality associated with prior devices, which criticality contributes to manufacturing costs, is reduced with regard to the drop dispensor of the present invention. While the drop dispensing device of the present invention has been disclosed in the context of a drop dispenser for dispensing ink, as can be appreciated, the device is suitable for many other drop dispensing applications including the drop-wise dispensing of various chemicals.

In the present invention, the inks employed may be of the conductive or non-conductive type. In the event a solvent based ink is employed, a solvent resistant plastic resin will be selected for the parts of the drop dispenser.

Thus, it will be appreciated from the above that as a result of the present invention, a highly effective drop dispensing device is provided by which the principal objective, among others, is completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims.

What is claimed is:

1. A drop dispensing device comprising:

means defining a planar electroactuator bounded by a peripherally circumferential surface;

means defining a fluid receiving chamber having at least a first plastic resin wall connected to said peripherally circumferential surface of said electroactuator and a second wall spaced from said first wall; and nozzle means in fluid communications with said fluid receiving chamber, said planar electroactuator applying a peripherally circumferentially directed force to said first wall in response to electrical excitation to cause a predetermined quantity of fluid to be ejected through said nozzle in a drop-wise manner.

2. The drop dispensing device of claim 1, wherein said electroactuator is defined as a circular disc and said fluid receiving chamber is defined as an annulus by said first and second plastic resin walls.

3. The drop dispensing device of claim 1, wherein said first wall is bonded to the peripheral surface of said electroactuator.

4. The drop dispensing device of claim 3, wherein said first wall is solvent-bonded to the peripheral surface of said electroactuator.

5. The drop dispensing device of claim 1 wherein said electroactuator is a piezoelectric device.

6. The drop dispensing device of claim 1, further comprising:

means for connecting said fluid receiving chamber to a source of fluid.

7. The drop dispensing device of claim 6, wherein said fluid is an ink.

8. The drop dispensing device of claim 7 wherein said ink is a conductive ink.

9. The drop dispensing device of claim 1, wherein said plastic resin is styrene-acrylonitrile.

10. The drop dispensing device of claim 1, wherein said plastic resin is polyphenylene sulfide.

11. A drop dispensing device comprising:

a first and second plastic resin components each having a circular end wall and an axially extending cylindrical wall, the axially extending cylindrical walls defined by respective inside and outside diameter dimensions, the axially extending cylindrical wall of the first component received within the axially extending cylindrical wall of the second component to define an annular fluid receiving chamber therebetween;

a discoidal electroactuator bounded by a curvilinear periphery bonded to the inside diameter surface of the axially extending cylindrical wall of the first component; and nozzle means in fluid communications with said annular fluid receiving chamber, said electroactuator applying a peripherally directed force to the axially extending cylindrical wall of the first component in response to electrical excitation to cause a predetermined quantity of fluid to be ejected through said nozzle in a drop-wise manner.

12. The drop dispensing device of claim 11, wherein said electroactuator is defined as a circular disc.

13. The drop dispensing device of claim 11, wherein the curvilinear periphery of the electroactuator is solvent-bonded to the inside diameter surface of the axially extending wall of the first component.

14. The drop dispensing device of claim 11 wherein said electroactuator is a piezoelectric device.

15. The drop dispensing device of claim 11, further comprising:

means for connecting the fluid receiving chamber to a source of fluid.

16. The drop dispensing device of claim 15, wherein said fluid is an ink.

17. The drop dispensing device of claim 16 wherein said ink is a conductive ink.

18. The drop dispensing device of claim 11, wherein said plastic resin is styrene acrylonitrile.

19. The drop dispensing device of claim 11, wherein said plastic resin is polyphenylene sulfide.

20. A drop forming device comprising:

means defining a plastic resin body having a fluid receiving chamber formed therein, the chamber defined along a curvilinear path between at least two spaced apart plastic resin walls;

means defining a nozzle in fluid communication with said chamber; and an electroactuator having a curvilinear periphery connected to one of said walls and actuatable to circumferentially extend at least one of said walls to cause a quantity of fluid in said chamber to pass through said nozzle to form a fluid drop.

21. The drop forming device of claim 20, wherein said chamber is defined along a closed curvilinear path.

22. The drop forming device of claim 20, wherein said chamber is an annular chamber and said at least two spaced walls are concentric with one another.

23. The drop forming device of claim 20, wherein said electroactuator is solvent bonded to one of said walls.

24. The drop forming device of claim 20 wherein said electroactuator is a piezoelectric device.

25. The drop forming device of claim 20, further comprising:

means for connecting said fluid receiving chamber to a source of fluid.

26. The drop forming device of claim 20, wherein said fluid is an ink.

27. The drop forming device of claim 26 wherein said ink is a conductive ink.

28. The drop forming device of claim 20, wherein said plastic resin is styrene acrylonitrile.

29. The drop forming device of claim 20, wherein said plastic resin is poly-phenylene sulfide.

30. A drop dispensing device comprising:

means defining a planar electroactuator bounded by a peripheral surface;

means defining a fluid receiving chamber having at least a first plastic resin wall connected to said peripheral surface of said electroactuator and a second wall spaced from said first wall; and nozzle means in fluid communications with said fluid receiving chamber, said planar electroactuator applying a peripherally directed force to said first wall in response to electrical excitation to cause a predetermined quantity of fluid to be ejected through said nozzle in a drop-wise manner;

said first wall having a thickness sufficient to be formed by injection molding but having a thickness insufficient to prevent said electroactuator from ejecting said fluid through said nozzle.

* * * * *